United States Patent [19]

Hannan et al.

[11] 4,004,133
[45] Jan. 18, 1977

[54] CREDIT CARD CONTAINING ELECTRONIC CIRCUIT

[75] Inventors: William James Hannan, Palm Beach Gardens; Edwin Maxwell Fulcher, Lake Park; Randy Deleon Rhodes, Palm Beach Gardens; Robert George Saenz, Palm Beach, all of Fla.

[73] Assignee: RCA Corporation, New York, N.Y.

[22] Filed: Dec. 30, 1974

[21] Appl. No.: 537,439

[52] U.S. Cl. .................. 235/61.7 B; 235/61.12 C; 235/61.11 A; 340/173 SP
[51] Int. Cl.² .................. G06K 7/06; G06K 19/06; G11C 11/44
[58] Field of Search ................................ 360/2, 131; 235/61.12 C, 61.12 R, 61.11 A, 61.7 B, 61.11 H, 61.8 A, 61.12 N, 61.9 R; 340/149 A, 173 SP, 258, 146.3 K, 172.5; 200/46; 209/111.5

[56] References Cited
UNITED STATES PATENTS

| | | | |
|---|---|---|---|
| 2,774,060 | 12/1956 | Thompson | 340/258 |
| 2,849,542 | 8/1958 | MacChesney | 235/61.12 M |
| 3,377,616 | 4/1968 | Aver | 340/146.3 K |
| 3,438,489 | 4/1969 | Cambornac | 209/111.5 |
| 3,702,464 | 11/1972 | Castrucci | 340/173 SP |
| 3,831,119 | 8/1974 | Ambrosio | 235/61.11 A |
| 3,832,530 | 8/1974 | Reitboeck | 235/61.11 H |
| 3,849,633 | 11/1974 | Reitboeck | 235/61.12 N |
| 3,851,153 | 11/1974 | Matsumoto | 235/61.12 M |
| 3,868,057 | 2/1975 | Chavez | 235/61.7 B |
| 3,906,460 | 9/1975 | Halpern | 235/61.8 A |

Primary Examiner—Daryl W. Cook
Assistant Examiner—Robert M. Kilgore
Attorney, Agent, or Firm—Carl V. Olson; Edward J. Norton

[57] ABSTRACT

An article such as a plastic credit card contains concealed identifying information. The information is in the form of a series of binary information bits and it is stored in an electronic serial memory. The memory is on an integrated circuit chip imbedded in the credit card with electrical connections to two terminals on opposite surfaces of the card. The stored information bits are read out from the credit card by an apparatus which supplies current to the terminals to energize readout from the serial memory. The information bits read out are in the form of sequential variations in the current flowing to the credit card which are detected and accumulated in a shift register for utilization by a display device or a computer.

13 Claims, 8 Drawing Figures

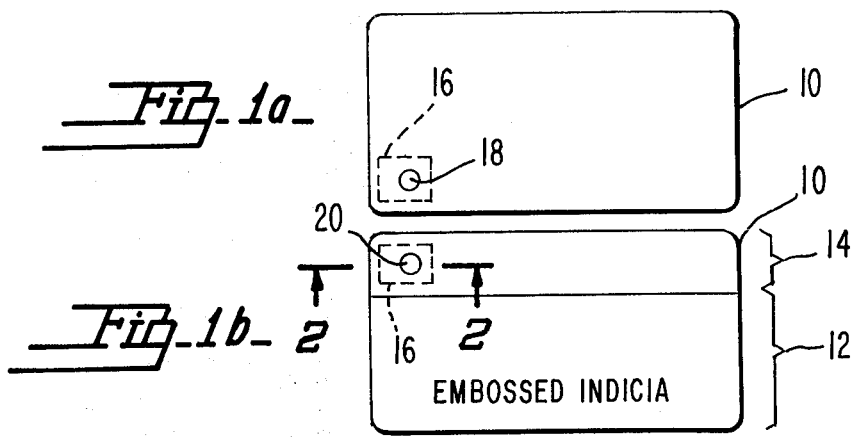
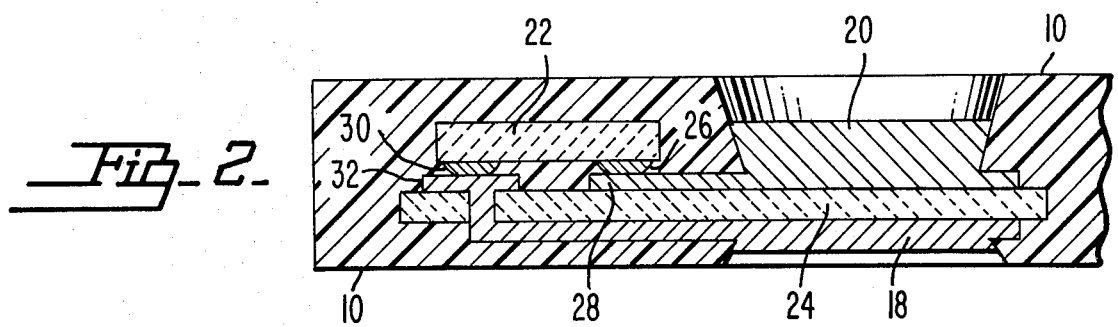
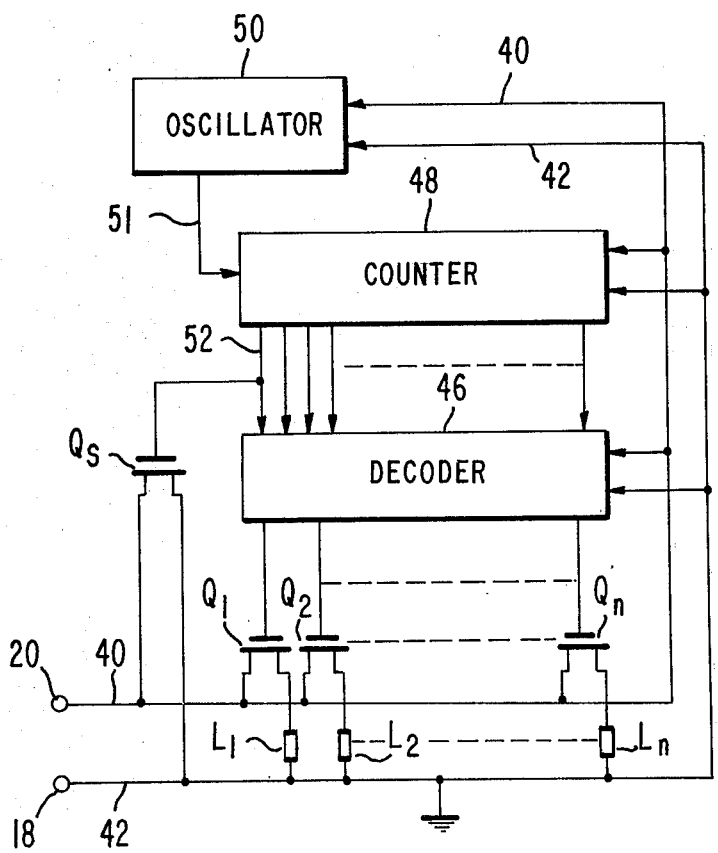

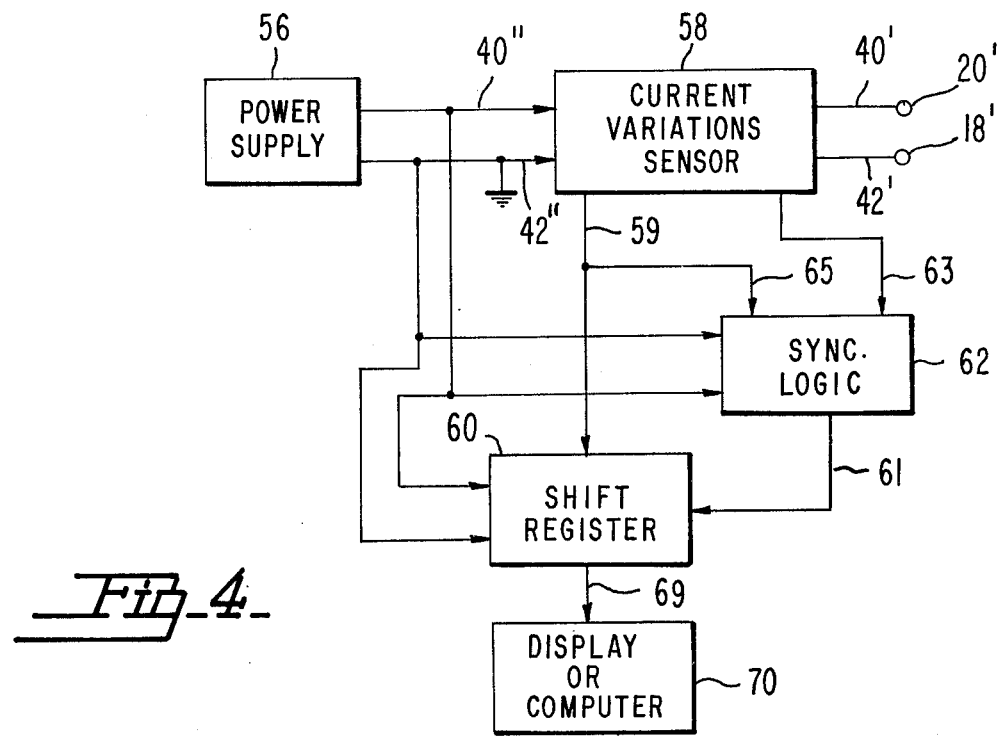
Fig_4_
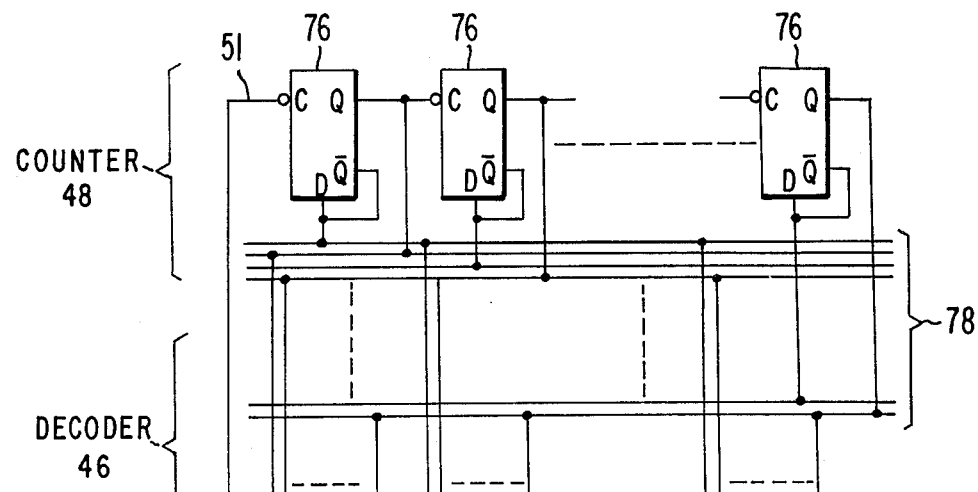
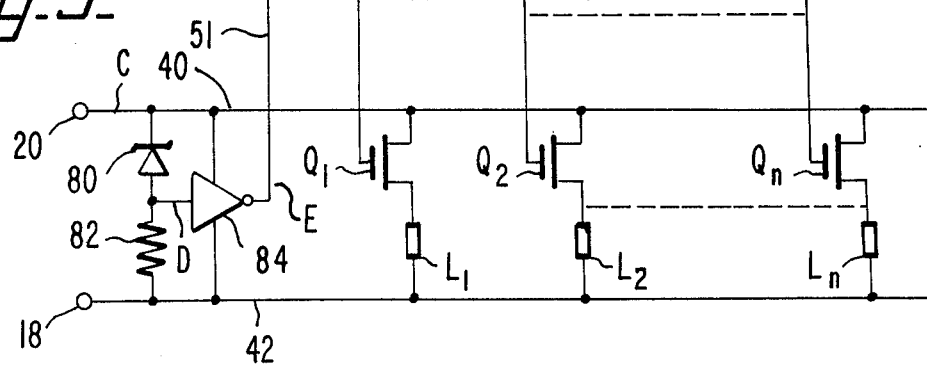
Fig_5_

Н4,004,133

CREDIT CARD CONTAINING ELECTRONIC CIRCUIT

BACKGROUND OF THE INVENTION

Credit cards are now fully accepted and widely used for facilitating purchases on credit of goods and services. The credit card identifies the bearer by name and by the number of his account to which purchases will be charged. The name and account number are represented by raised or embossed letters and numbers on the plastic card. This information is customarily recorded on a sales slip by means of a pressure printing device. Checks on the validity of the credit card, and the entering of the sales information into a computer system, generally have required the sales person to read the embossed information from the card and communicate the information to a central point by telephone or by manually operating a computer terminal keyboard. This results in human errors and delays which contribute to inefficiency and customer dissatisfaction.

There is a clear need for a fast and reliable apparatus for automatically sensing the information on a credit card and communicating the information to a central accounting computer. To this end card readers have been proposed which employ mechanical fingers, or optical beams or focused accoustic waves to sense the raised letters and numbers on the card. Other proposed systems involve credit cards with holograms, or surface corrugations, or magnetic inserts, or holes, or resistors arranged to represent the identifying information.

The most important characteristic of a credit card system is that the reading of information from the card be accurate. A second desirable characteristic is that the cards should be relatively counterfeit proof. A third desirable characteristic may be that the card should contain at least some concealed information known only to the card owner which can be used to verify that the bearer of the card is the legitimate owner of the card. Finally, it is desirable that readout of stored information not require a carefully controlled progressive movement of the card relative to the reading apparatus.

SUMMARY OF THE INVENTION

A credit card or article includes an electronic serial memory embedded in an insulating material with at least two exposed electrical terminals. The serial memory stores an identifying binary number which is read out from the terminals when an energizing current is supplied to the terminals.

BRIEF DESCRIPTION OF THE DRAWING

FIGS. 1A and 1B show opposite sides of a credit card having an embedded electronic serial memory storing identifying binary information;

FIG. 2 is a fragmentary sectional view taken on the line 2—2 of FIG. 1B;

FIG. 3 is a diagram of the electronic circuits constituting the serial memory embedded in the card of FIG. 1 and also included in FIG. 2;

FIG. 4 is a diagram of the electronic circuits included in a card reader for reading out and accumulating the identifying binary information stored in a serial memory embedded in a credit card;

FIG. 5 is a diagram of alternative electronic circuits, not including an oscillator, for use in a credit card;

DESCRIPTION OF FIGS. 1 THROUGH 4

Figure 6:
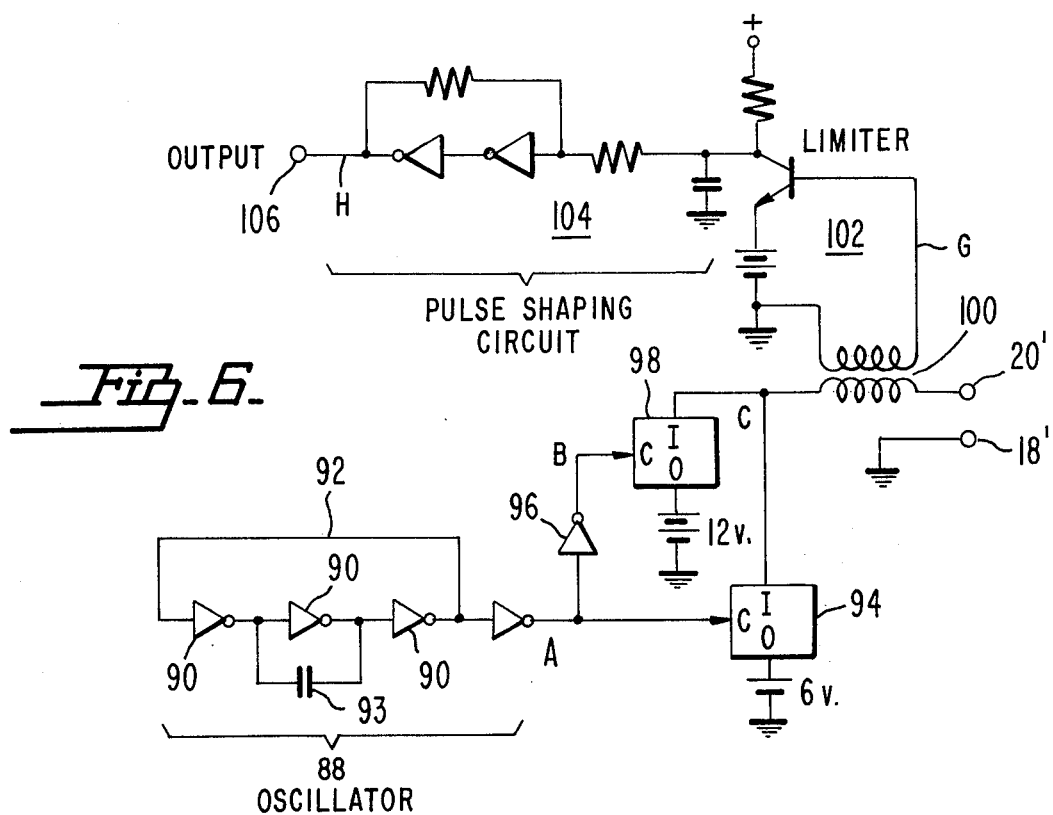
FIG. 6 is a diagram of electronic circuits, including an oscillator, for use in a card reader responding to cards of the type shown in FIG. 5.

Referring now in greater detail to FIGS. 1A and 1B, there is shown a credit card including a plastic insulating substrate 10 having dimensions of a standard credit card which are about 86 mm × 54 mm × 1 mm. The area 12 of the card may have a standard thickness with raised or embossed indicia. The area 14 of the card may have a thickness greater than the thickness of area 12 and equal to or less than the thickness of the card plus the embossed indicia. An electronic serial memory assembly 16 is embedded in the thick area 14 of the card with exposed electrical terminals 18 and 20.

FIG. 2 is a sectional view showing the electronic serial memory assembly of hybrid package 16 embedded in the plastic insulating substrate 10. The package consists of an integrated circuit chip 22 mounted on a ceramic substrate 24. The chip 22 may be a C/MOS field effect transistor integrated circuit chip having a solder or gold bump 26 fused to a thick film metalization path 28 on the ceramic substrate 24, which is in turn in contact with the terminal 20 exposed on one side of the credit card. The chip 22 has another solder or gold bump 30 fused to a thick film metalization path 32 extending from the top side of the ceramic substrate 24 and through an aperture therein to the opposite side of the ceramic substrate where it makes contact with the terminal 18 exposed on the other side of the credit card. The memory assembly or hybrid package may be embedded in the thermoplastic credit card substrate 10 at the time that the card is molded.

FIG. 3 shows the electronic read-only serial memory circuit on the integrated circuit chip 22 in FIG. 2. The serial memory includes a plurality of N-channel MOS transistors Q1, Q2 . . . Qn each having a drain electrode connected through a supply voltage bus 40 to terminal 20, and having a source electrode connected through a respective fusible link L1, L2, . . . Ln and through a ground or reference voltage bus 42 to terminal 18. Each binary information bit stored in the serial memory is determined by the condition of a respective one of the fusible links L. Each link may be left intact to represent a "1" bit, or may be fused or burned out to an open circuit to represent a "0" bit. This initial programming or insertion of stored information may be accomplished prior to assembly of the memory in the plastic credit card, or may be accomplished by known apparatus connected to the terminals 20 and 18 of the completed credit card.

Each field effect transistor Q1, Q2 . . . Qn has a gate electrode connected to a respective output of a decoder 46. The decoder is connected to receive output signals from the plural stages of a binary counter 48. The counter in turn receives the output of an oscillator 50 over line 51. A first output 52 of counter 48 is connected to the gate electrode of a synchronizing field effect transistor Qs which has drain and source electrodes connected to the supply voltage bus 40 and the reference voltage bus 42. The decoder 46, counter 48 and oscillator 50 may have a circuit diagram as shown in FIG. 5.

FIG. 4 is a block diagram of a card reader apparatus for reading out the binary information bits stored in the credit card serial memory circuit shown in FIG. 3. A power supply 56 supplies bias current through bus 40", 42" and through a current variation sensor 58 to bus 40', 42', which has means for connection to the terminals 20, 18 and the bus 40, 42 in the credit card. Transistions in the value of current are passed through the current variation sensor 58 to the credit card and detected and applied over line 59 as input pulses to a shift register 60. The operation of the shift register is started and controlled over line 61 by a synchronizing logic circuit 62 which receives a start bit over line 63, and data bits over line 65, from the current sensor 58. The binary information accumulated in the shift register 60 is transferred in bit serial or bit parallel form over bus 69 to a utilization device 70 such as a display terminal or a computer.

OPERATION OF FIGS. 1 THROUGH 4

In the operation of reading out the information stored in a credit card according to the invention, the terminals 18, 20 of the credit card in FIGS. 1, 2 and 3 are brought into contact with the terminals 18', 20' of the card reader of FIG. 4. This permits current from the power supply 56 to flow to the card and energize the electronic serial memory therein. The oscillator 50 is put into operation supplying pulses to the counter 48. The counter output 52 is energized for a short time to render transistor $Q_s$ momentarily conductive, so that a transition or fluctuation occurs in the power supply current supplied to the memory in the card. This current change is detected by the current variation sensor 58 which conditions the shift register 60 to receive the subsequently read out information bit.

The counter 48 in the serial memory counts in binary fashion producing changing patterns of outputs on its plural output leads connected to the decoder 46. The decoder senses the changing combinations of input signals and sequentially energizes its outputs enabling transistors $Q_1, Q_2 \ldots Q_n$ in sequence. Each transistor produces a variation in the current through bus 40, 42 if the associated fusible link $L_1, L_2 \ldots L_n$ is intact, to represent a 1 information bit, and produces no current variation if the associated fusible link is burned out. Each variation in current is sensed by the current variation sensor 58 in the card reader apparatus, and the resulting serial information bit signals are accumulated in the shift register 60 for utilization by a display device or computer 70.

DESCRIPTION OF FIGS. 5 AND 6

FIGS. 5 and 6 shown an alternative credit card circuit and an alternative credit card reader circuit differing from the circuits of FIGS. 3 and 4 in that the oscillator 50 in FIG. 3 is not located in the credit card, but is instead located in the card reader. The circuit in the credit card is thus simpler, and this has a system economy advantage because there will be relatively many more cards than card readers.

In FIG. 5, credit card circuit elements are given the same numerals as corresponding elements in FIG. 3. The counter 48 is shown to consist of a series of "D type" flip-flops 76. A clock pulse wave is applied over line 51 to the first of the flip-flops, and the output thereof is passed in succession to the following flip-flops. The outputs Q of individual flip-flops are connected to respective conductors of a bus 78. The decoder 46 consists of a plurality of coincidence gates 79 having inputs connected to conductors of bus 78 in a pattern such that the gates 79 are enabled in succession as the counter counts the clock pulses applied to its input 51. The gates 79 successively turn on the field effect transistors $Q_1$ through $Q_n$ and cause current flows through the respective transistors, except for those transistors which have open circuited links representing the storage of a 0 information bit. Intact fusible links, illustrated at $L_1$ through $L_n$, represent 1 information bits.

The clock pulses applied over line 51 to the counter 48 are derived from an oscillator located in the card reader as will be described in connection with FIG. 6. The oscillations are applied to the card through the terminals 18 and 20. A zener diode 80 and a resistor 82 are used to convert the oscillator wave at a 6 volts to 12 volts level to a wave at a zero volts to 6 volts level at D for application to the control input of an inverter 84. The output at E of the inverter 84 is a wave varying between zero volts and 6 volts and is suitable for application to the counter 48. The inverter 84 is supplied with power by means of connections to the bus 40, 42, which is in turn supplied with power through terminals 20, 18 from the card reader of FIG. 6. The decoder 46 and the counter 48 in FIG. 5 are similarly supplied with power from bus 40, 42 over lines not shown.

FIG. 6 shows the circuit of a card reader suitable for activating and reading the card circuit of FIG. 5. A ring oscillator 88 consists of an odd number of inverters 90 provided with a feedback path 92 to cause oscillation. Additional frequency affecting feedback is provided by a capacitor 93. Any one of many other types of oscillators may be used in place of the ring oscillator shown.

Figure 7:
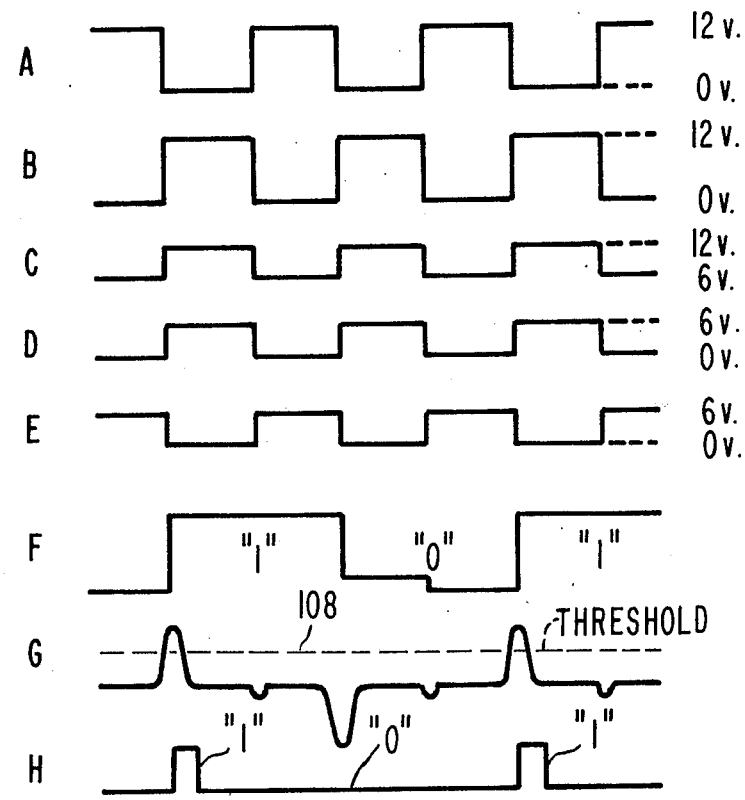
FIG. 7 is a chart of waveforms which will be referred to in describing the operation of the system of FIGS. 5 and 6.

The output A from oscillator 88 is shown in FIG. 7 and is applied directly to a transmission gate or switch 94, and is applied through an inverter 96 to a transmission gate or switch 98. Gate 94 is in circuit with a 6-volt supply, and gate 98 is in circuit with a 12-volt supply. Since the two gates are alternately enabled, the common output at C of the two gates is a clock wave switching between a 6-volt level and a 12-volt level. This clock wave is applied through the primary coil of a transformer 100 to the card reader terminal 20'. A ground potential is applied to the other card reader terminal 18'.

The secondary coil of transformer 100 is connected in the input circuit of a transistor limiter circuit 102. The output of limiter 102 is connected through a pulse shaping circuit 104 to an output terminal 106.

OPERATION OF FIGS. 5 AND 6

The oscillator 88 in the card reader of FIG. 6 provides oscillations A in FIG. 7 which are inverted at B and translated at C and terminal 20' to a clock wave switching between 6-volt and 12-volt levels relative to ground potential. The clock wave applied to the terminal 20 of the credit card (FIG. 5) is translated at D to a clock wave varying between zero volts and 6 volts. The inverter 84 provides a clock output E in FIG. 7 which varies between zero volts and 6 volts and is applied over line 51 to the clock input of counter 48. The counter is thus made to count, causing the decoder 46 to sequentially turn on transistors $Q_1$ through $Q_n$.

If the associated link $L_1$ is intact, the conduction through transistor $Q_1$ when turned on by the decoder 46 causes a large current flow through conductor 40, terminals 20 and 20' and the primary coil of transformer 100 from the transmission gates 94 and 98 in the card reader, FIG. 6. This is represented by the pulse labeled 1 in current waveform F in FIG. 7. If the next link $L_2$ is open circuited, a much smaller current flows labeled 0 in waveform F in FIG. 7. The current transitions in the waveform F produce voltage pulses as shown by waveform G in the input circuit of transistor limiter 102 in FIG. 6. The circuit produces a limiting or clipping action and amplifies solely the signals exceeding a threshold value 108. The clipped signal is then amplified and shaped to produce the output wave H at output terminal 106. Each pulse represents a 1 stored in the memory in the card, and each absent pulse represents a 0 stored. The number-representing waveform read out from the card can then be modified in any desired way to be recognized and operated upon by a computer performing accounting functions.

The storage in and readout of identifying information from the credit card is accomplished by integrated circuits which are inherently very reliable and accurate in operation. The described credit card provides for the storage of identifying information in a manner which is practically counterfeit proof. The system also has the additional desirable characteristics of permitting the storage of concealed information, and of providing a readout of the stored information without a requirement of carefully moving the card relative to the card reader.

Since the serial memory integrated circuit is so small, having a dimension of about one-fourth of an inch or smaller, the serial memory can be imbedded in an insulating article other than a credit card. The memory may for example be imbedded in a finger ring. Such a credit ring has the advantages of being relatively secure from being lost or misplaced, and of being attractive as a status symbol.

What is claimed is:

1. An article adapted to be carried on the person of an individual and containing concealed identifying information, comprising
    an insulating substrate provided with visible indicia,
    an electronic serial memory storing an identifying binary value imbedded in said substrate, said serial memory including a counter, a decoder responsive to the output of said counter, and a plurality of bit-storage circuits each storing a 1 or a 0 information bit and being responsive sequentially to the output of said decoder, and
    electrical terminals on at least one surface of said substrate connected to said memory for the application of an energizing current from an external power source to the memory.

2. An article as defined in claim 1 wherein said substrate is a credit card.

3. An article as defined in claim 1 wherein said electrical terminals are solely two in number located on two opposite surfaces of said substrate, said bit-storage circuits when sequentially energized causing sequential information-bearing variations in said energizing current.

4. An article as defined in claim 1 wherein said memory is a read-only memory.

5. An article as defined in claim 1 wherein said counter is an address counter responsive to the output of an oscillator, and said bit-storage circuits are transistor circuits.

6. An article as defined in claim 5 wherein said memory includes an oscillator having its output coupled to said address counter.

7. An article as defined in claim 5 wherein said transistor circuits each store a binary bit represented by the condition of a fusible link.

8. An article as defined in claim 5 wherein said transistors are connected across two of said electrical terminals.

9. An article as defined in claim 1, and means to read out the identifying binary number, comprising
    means connecting a power supply to said terminals on the substrate of said article to energize said serial memory, and
    means connected to said terminals to detect binary information bits read out serially from said memory.

10. The combination as defined in claim 9 wherein said means to detect the information read from the memory comprises means to detect changes in the power supply current supplied to the article.

11. The combination as defined in claim 10, and in addition, a shift register receptive to said means to detect binary information bits read out serially from the memory, to accumulate and store the bits.

12. A system useful for personal identification and credit purposes, comprising
    an article adapted to be carried by an individual and comprising an insulating substrate containing two surface terminals connected to an imbedded electronic serial memory storing an identifying binary value,
    said electronic serial memory including an address counter responsive to a clock pulse wave, a decoder responsive to the address counter, and transistor bit-storage circuits connected to said terminals and responsive sequentially to the output of the decoder, and
    means to read out the binary value from the serial memory comprising means to supply an electric current through said surface terminals to energize said memory, and means to detect said stored information as changes in said electric current.

13. The combination as defined in claim 12 wherein said means to read out the binary value includes an oscillator supplying a clock pulse wave superimposed on said electric supply current, and wherein said article includes means to derive a clock pulse wave from said electric supply current and supply it to said address counter.

* * * * *